US008581422B2

(12) United States Patent
Aoshima (10) Patent No.: US 8,581,422 B2
(45) Date of Patent: Nov. 12, 2013

(54) SEMICONDUCTOR MODULE

(75) Inventor: Masaki Aoshima, Toyota (JP)

(73) Assignee: Toyota Jidosha Kabushiki Kaisha, Toyota-Shi (JP)

( * ) Notice: Subject to any disclaimer, the term of this patent is extended or adjusted under 35 U.S.C. 154(b) by 0 days.

(21) Appl. No.: 13/611,568

(22) Filed: Sep. 12, 2012

(65) Prior Publication Data

US 2013/0168845 A1    Jul. 4, 2013

Related U.S. Application Data

(63) Continuation of application No. PCT/JP2011/074409, filed on Oct. 24, 2011.

(51) Int. Cl.
*H01L 23/29* (2006.01)

(52) U.S. Cl.
USPC ............... 257/785; 257/E21.515; 438/117

(58) Field of Classification Search
USPC ..................... 257/785, E21.515; 438/117
See application file for complete search history.

(56) References Cited

U.S. PATENT DOCUMENTS

| 1,341,771 | A |   | 6/1920  | Allender |
| 3,296,506 | A | * | 1/1967  | Steinmetz, Jr. et al. ........ 257/785 |
| 3,463,976 | A | * | 8/1969  | Steinmetz, Jr. et al. ........ 257/785 |
| 5,866,944 | A |   | 2/1999  | Hiyoshi et al. |
| 6,380,622 | B1 |  | 4/2002  | Hirai et al. |
| 7,396,480 | B2 | * | 7/2008 | Kao et al. ................. 216/58 |
| 7,534,979 | B2 |  | 5/2009  | Ito et al. |
| 2005/0285016 | A1 | * | 12/2005 | Kong et al. ............. 250/208.1 |
| 2013/0062749 | A1 | * | 3/2013 | Imai ...................... 257/690 |
| 2013/0093095 | A1 | * | 4/2013 | Orimoto .................. 257/773 |

FOREIGN PATENT DOCUMENTS

| JP | 2-15643 A | 1/1990 |
| JP | 9-252067 A | 9/1997 |
| JP | 2001-102400 A | 4/2001 |
| JP | 2002-057263 A | 2/2002 |
| JP | 2009-13800 A | 1/2009 |

OTHER PUBLICATIONS

International Search Report & Written Opinion mailed Nov. 29, 2011 of PCT/JP2011/074409.
http://www.denso.co.jp/ja/news/newsreleases/2007/070523-01.html, News Release of Denso Corporaton, May 23, 2007.
International Search Report & Written Opinion mailed Nov. 29, 2011 of PCT/JP2011/070810.
International Search Report & Written Opinion mailed Nov. 29, 2011 of PCT/JP2011/073563.
U.S. Appl. No. 13/613,646, Office Action mailed Sep. 10, 2013.
U.S. Appl. No. 13/554,254, Notice of Allowance mailed Sep. 4, 2013.

* cited by examiner

*Primary Examiner* — Jarrett Stark
*Assistant Examiner* — Nicholas Tobergte
(74) *Attorney, Agent, or Firm* — Kenyon & Kenyon LLP (57) ABSTRACT

A semiconductor module includes a semiconductor device, a first conductive member, a second conductive member, a cylinder, and a cover. The first conductive member is in contact with a first electrode of the semiconductor device. The second conductive member is in contact with a second electrode of the semiconductor device. The cylinder encompasses the semiconductor device and is fixed to the first conductive member, and a first thread groove is formed on the cylinder. A second thread groove is formed on the cover. The cover is fixed to the cylinder by an engagement of the second thread groove with the first thread groove. The semiconductor device and the second conductive member are fixed by being sandwiched between the first conductive member and the cover. The second conductive member includes a portion extending from inside to outside the cylinder by penetrating an outer peripheral wall of the cylinder.

4 Claims, 5 Drawing Sheets

SEMICONDUCTOR MODULE

CROSS-REFERENCE TO RELATED APPLICATIONS

This is a Continuation of International Application No. PCT/JP2011/074409 filed on Oct. 24, 2011, the disclosure of which is hereby incorporated by reference herein in its entirety.

TECHNICAL FIELD

The technique disclosed in the present specification relates to a semiconductor module.

BACKGROUND ART

When a semiconductor device generates heat, the heat causes the semiconductor device and peripheral members thereof (solder, wiring, and the like) to thermally expand. Due to differences in coefficients of thermal expansion among the respective members, stress acts on the semiconductor device. Such stress reduces lives of the semiconductor device and semiconductor module.

SUMMARY

In order to reduce the aforementioned stress, a connection of the semiconductor device to a conductive member that does not involve joining with a brazing material such as solder is under consideration. For example, Japanese Patent Application Publication No. H9-252067 (hereinafter, referred to as a patent document 1) discloses a semiconductor module in which a semiconductor device and respective electrodes are connected to each other by laminating and pressurizing the semiconductor device and the respective electrodes. However, with this semiconductor module, a first electrode is arranged so as to extend downward from the semiconductor device, and a second electrode is arranged so as to extend upward from the semiconductor device. If the first electrode and the second electrode are separated from each other in this manner, a problem of an increased inductance between the first electrode and the second electrode arises. In consideration thereof, in the present specification, a semiconductor module is provided in which a semiconductor device and conductive members are connected by pressurization and an inductance between the respective conductive members is low.

A semiconductor module disclosed in the present specification includes a semiconductor device, a first conductive member, a second conductive member, a cylinder, and a cover. The semiconductor device includes a semiconductor substrate, a first electrode formed on one surface of the semiconductor substrate, and a second electrode formed on a surface of the semiconductor substrate opposite to the one surface. The first conductive member is in contact with the first electrode. The second conductive member is in contact with the second electrode. The cylinder encompasses the semiconductor device and is fixed to the first conductive member. The first thread groove is formed on an outer peripheral surface or an inner peripheral surface of the cylinder. A second thread groove is formed on the cover. The cover is fixed to the cylinder by an engagement of the second thread groove and the first thread groove. The semiconductor device and the second conductive member are fixed by being sandwiched between the first conductive member and the cover. The second conductive member includes an extending portion extending from inside the cylinder to outside the cylinder by penetrating an outer peripheral wall of the cylinder which is located on a side of the first conductive member with respect to the cover.

In the semiconductor module described above, the extending portion of the second conductive member extends from inside the cylinder to outside the cylinder by penetrating an outer peripheral wall of the cylinder. Therefore, the extending portion can be arranged along the first conductive member on the outside of the cylinder. Consequently, in the semiconductor module, an inductance between the first conductive member and the second conductive member is low. In addition, the extending portion penetrates the outer peripheral wall of the cylinder which is located on the side of the first conductive member with respect to the cover. In other words, the extending portion penetrates the outer peripheral wall of the cylinder without penetrating the cover. Consequently, the cover can be installed to the cylinder by rotating the cover (in other words, by engaging the second thread groove with the first thread groove). As a result, the semiconductor module can be assembled with ease.

DESCRIPTION OF EMBODIMENTS

In the semiconductor module described in this specification, a third electrode may be further formed on the one surface of the semiconductor substrate. In this case, favorably, the semiconductor module may further include a third conductive member being in contact with the third electrode and extending from inside the cylinder to outside the cylinder by penetrating the outer peripheral wall of the cylinder which is located on the side of the first conductive member with respect to the cover.

Furthermore, in any of the semiconductor modules described in this specification, since wirings to the semiconductor device (for example, the second conductive member and the third conductive member) extend to outside the cylinder by penetrating the outer peripheral wall of the cylinder, a wiring extension structure need not be provided on the first conductive member and on the cover. Therefore, a cooler can be connected to the first conductive member and the cover, and the semiconductor device can be cooled in a preferable manner. To this end, in any of the semiconductor modules described above, favorably, a first cooler may be connected to a surface of the first conductive member which is opposite to the semiconductor device, and a second cooler is connected to a surface of the cover which is opposite to the semiconductor device.

Furthermore, in any of the semiconductor modules described in this specification, favorably, an insulating member may be located between the third conductive member and the first conductive member, and the third conductive member may be fixed by being sandwiched between the third electrode and the insulating member.

According to such a configuration, since the third conductive member and the third electrode are connected due to pressurization, a stress that acts on the semiconductor device in a vicinity of the third electrode is reduced.

(First Embodiment)

Figure 1:
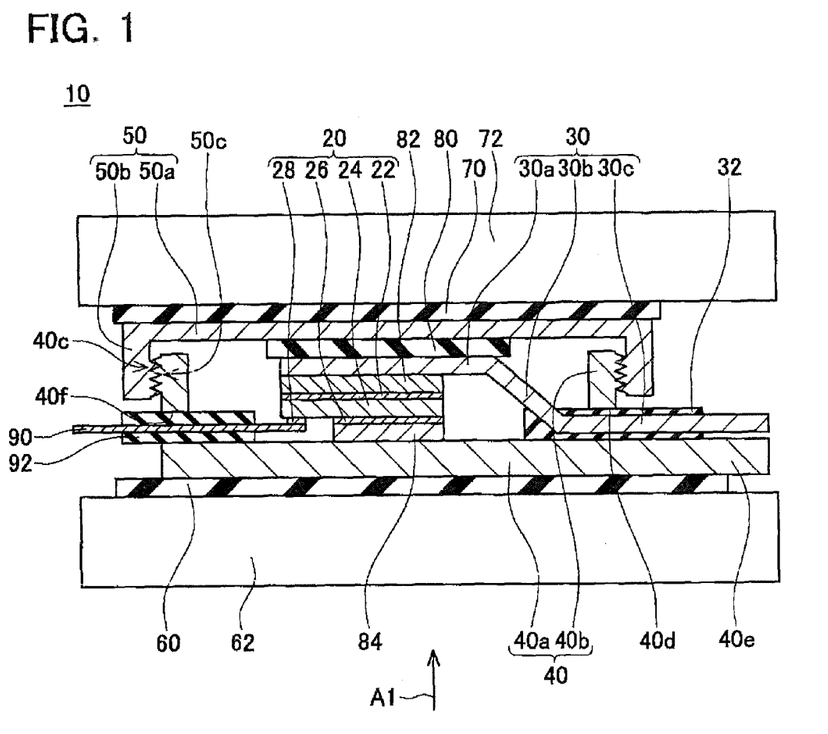
FIG. 1 is a longitudinal cross-sectional view of a semiconductor module 10 according to a first embodiment.
Figure 2:
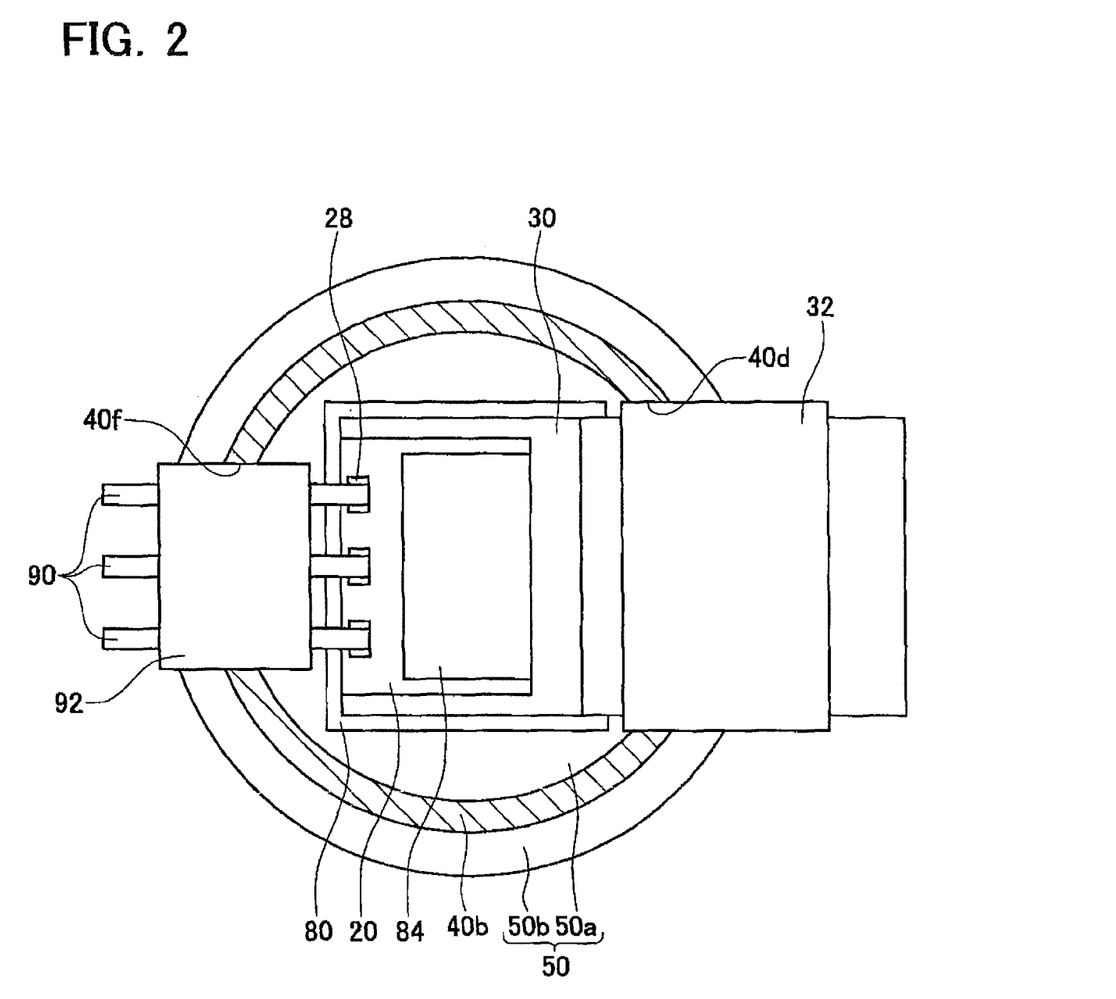
FIG. 2 is a plan view in which the semiconductor module 10 is viewed along an arrow A1 in FIG. 1 and in which an electrode plate 40a and coolers 62 and 72 are not shown.

A semiconductor module 10 shown in FIG. 1 and FIG. 2 is an assembly in which a semiconductor device 20 is housed in a case 40 and a cover 50.

The case 40 is formed of metal. The case 40 includes an electrode plate 40a and a cylinder 40b. The electrode plate 40a is formed in an approximately planar shape. The cylinder 40b is formed in a cylindrical shape with a central axis extending perpendicular to the electrode plate 40a. A lower end of the cylinder 40b is connected to the electrode plate 40a. In other words, a lower end of a central hole of the cylinder 40b is blocked by the electrode plate 40a. A part 40e of the electrode plate 40a extends outward from an outer peripheral surface of the cylinder 40b. A thread groove 40c is formed on the outer peripheral surface of the cylinder 40b. Penetrating holes 40d and 40f are formed on the cylinder 40b on a lower side (a side of the electrode plate 40a) of the thread groove 40c.

A metal plate 84, the semiconductor device 20, a metal plate 82, a bus bar 30, an insulating plate 80, and three pins 90 are installed on the electrode plate 40a. The metal plate 84, the semiconductor device 20, the metal plate 82, and the insulating plate 80 are installed inside the cylinder 40b. The bus bar 30 and the pins 90 are installed so as to penetrate the outer peripheral wall of the cylinder 40b.

The metal plate 84 is mounted on the electrode plate 40a. The metal plate 84 is constructed of a relatively soft metal such as tin and silver (silver paste).

The semiconductor device 20 is installed on the metal plate 84. The semiconductor device 20 includes a semiconductor substrate 24 constructed of SiC. A MOSFET is formed on the semiconductor substrate 24. A source electrode 26 of the MOSFET and a plurality of gate electrodes 28 of the MOSFET are formed on a lower surface of the semiconductor substrate 24.

As shown in FIG. 2, the semiconductor substrate 24 has a rectangular shape. The plurality of gate electrodes 28 is arranged along one long side of the semiconductor substrate 24. As shown in FIG. 1, a drain electrode 22 of the MOSFET is formed on an upper surface of the semiconductor substrate 24. The semiconductor device 20 is mounted on the metal plate 84 so that the source electrode 26 comes into contact with the metal plate 84. The respective gate electrodes 28 are not in contact with the metal plate 84.

The metal plate 82 is installed on the semiconductor device 20. The metal plate 82 is formed of a relatively soft metal such as tin. The metal plate 82 is in contact with the drain electrode 22 of the semiconductor device 20.

The three pins 90 are connected to the gate electrodes 28, respectively. Each pin 90 extends from the gate electrode 28 to outside the cylinder 40b through a penetrating hole 40f formed on the outer peripheral wall of the cylinder 40b. The pin 90 within the penetrating hole 40f is covered by an insulator 92. Each pin 90 is fixed to the case 40 via the insulator 92. Each pin 90 is insulated from the case 40 by the insulator 92.

The bus bar 30 is formed of a bent metal plate. The bus bar 30 includes a first portion 30a, a second portion 30b, and a third portion 30c. The first portion 30a is placed on the metal plate 82. The second portion 30b extends from the first portion 30a toward a side of the electrode plate 40a. The third portion 30c extends from the second portion 30b along the electrode plate 40a. The third portion 30c extends from inside the cylinder 40b to outside the cylinder 40b through a penetrating hole 40d formed on the outer peripheral wall of the cylinder 40b. The bus bar 30 within the penetrating hole 40d is covered by an insulator 32. The bus bar 30 is insulated from the case 40 by the insulator 32.

The insulating plate 80 is mounted on the first portion 30a of the bus bar 30.

The cover 50 is constructed of metal. An insulation coating is applied to an outer surface of the cover 50. The cover 50 includes a cylindrically-shaped side wall portion 50b and a flat plate portion 50a that blocks one end of a central hole of the side wall portion 50b. In other words, the cover 50 is shaped like a cup. A thread groove 50c is formed on an inner peripheral surface of the side wall portion 50b. The thread groove 50c of the cover 50 engages with the thread groove 40c of the case 40. In other words, the cover 50 is fastened to the case 40 using the thread grooves 40c and 50c. A lower surface of the flat plate portion 50a of the cover 50 is in contact with the insulating plate 80. More specifically, the flat plate portion 50a of the cover 50 and the electrode plate 40a of the case 40 sandwich a laminated body constituted by the metal plate 84, the semiconductor device 20, the metal plate 82, the first portion 30a of the bus bar 30, and the insulating plate 80. The cover 50 is fastened at a high torque to the case 40. As a result, the laminated body is pressurized by the flat plate portion 50a and the electrode plate 40a. Due to the pressure, respective members constituting the laminated body are fixed to the cover 50 and the case 40. Moreover, a contact portion of the electrode plate 40a of the case 40 and the metal plate 84, a contact portion of the metal plate 84 and the source electrode 26 of the semiconductor device 20, a contact portion of the drain electrode 22 of the semiconductor device 20 and the metal plate 82, and a contact portion of the metal plate 82 and the first portion 30a of the bus bar 30 are not joined by a brazing material or the like. Therefore, by detaching the cover 50 from the case 40, the respective members of the laminated body can be separated from each other.

An insulating sheet 70 is fixed to an upper surface of the flat plate portion 50a of the cover 50. A cooler 72 is fixed to an upper surface of the insulating sheet 70. The cooler 72 is a liquid circulation-type cooler. Moreover, grease is applied to a contact portion of the cover 50 and the insulating sheet 70 and to a contact portion of the insulating sheet 70 and the cooler 72. Consequently, thermal resistance between the cooler 72 and the cover 50 is reduced. In addition, an insulating sheet 60 is fixed to a lower surface of the electrode plate 40a of the case 40. A cooler 62 is fixed to a lower surface of the insulating sheet 60. The cooler 62 is a liquid circulation-type cooler. Moreover, grease is applied to a contact portion of the electrode plate 40a and the insulating sheet 60 and to a contact portion of the insulating sheet 60 and the cooler 62. Consequently, a thermal resistance between the electrode plate 40a and the insulating sheet 60 is reduced.

As described above, in the semiconductor module 10, a wiring to the source electrode 26 positioned on the lower surface of the semiconductor substrate 24 is constituted by the electrode plate 40a of the case 40. In addition, a wiring to the drain electrode 22 positioned on the upper surface of the semiconductor substrate 24 is constituted by the bus bar 30. The bus bar 30 extends to outside the cylinder 40b by penetrating the outer peripheral wall of the cylinder 40b. Accordingly, the extending portion 40e of the electrode plate 40a and the third portion 30c of the bus bar 30 are arranged close to and parallel to each other. Therefore, an inductance between the extending portion 40e of the electrode plate 40a and the third portion 30c of the bus bar 30 is reduced compared to a conventional semiconductor module. In other words, in the semiconductor module 10, an inductance between the wiring to the source electrode 26 and the wiring to the drain electrode 22 is reduced.

In addition, since the third portion 30c of the bus bar 30 is arranged close to the extending portion 40e of the electrode plate 40a, external wirings thereto can be readily installed. More specifically, in a hypothetical case in which a wiring member to the drain electrode 22 extends to an upper side of the semiconductor module 10, an external wiring to the drain electrode 22 must be connected at a distant position from the electrode plate 40a. In contrast, with the semiconductor module 10 according to the present embodiment, since the third portion 30c is arranged close to the extending portion 40e, external wirings thereto can be readily installed.

Furthermore, in the semiconductor module 10, the pins 90 that are the wiring to the gate electrodes 28 also extend to outside the cylinder 40b by penetrating the outer peripheral wall of the cylinder 40b. In other words, all of the wirings with the exception of the wiring constituted by the electrode plate 40a extend from inside the cylinder 40b to outside the cylinder 40b by penetrating the outer peripheral wall of the cylinder 40b which is located on a side of the electrode plate 40a with respect to the cover 50. Therefore, a structure for extending a wiring from inside to outside the case 40 and the cover 50 is not formed on the electrode plate 40a and the cover 50. As a result, a lower surface of the electrode plate 40a and an upper surface of the cover 50 are realized as flat shapes. Since the lower surface of the electrode plate 40a is flat, the cooler 62 is connected to the electrode plate 40a in a preferable manner. Consequently, the semiconductor device 20 can be cooled by the cooler 62 in an efficient manner. In addition, since the upper surface of the cover 50 is flat, the cooler 72 is connected to the cover 50 in a preferable manner. Consequently, the semiconductor device 20 can be cooled by the cooler 72 in an efficient manner. In other words, according to the semiconductor module 10, the semiconductor device 20 can be efficiently cooled from both surfaces.

Furthermore, in the semiconductor module 10, the semiconductor device 20 is fixed by pressure, and the semiconductor device 20 and the metal plates 82 and 84 are not joined with each other by brazing or the like. Therefore, when the semiconductor device 20 and the metal plates 82 and 84 thermally expand due to heat generated by the semiconductor device 20, stress is less likely to be applied to the semiconductor device 20. Consequently, the semiconductor module 10 has a long life.

Next, a method of manufacturing the semiconductor module 10 will be described. First, a component that integrates the insulator 92 and the three pins 90 is prepared, and each pin 90 is joined to each gate electrode 28 of the semiconductor device 20. The metal plate 84 is then placed on the electrode plate 40a within the cylinder 40b of the case 40. Next, the pins 90 and the semiconductor device 20 that are connected to each other are installed on the metal plate 84. In doing so, the semiconductor device 20 is placed on the metal plate 84 while inserting the pins 90 into the penetrating holes 40f of the cylinder 40b. When placing the semiconductor device 20 onto the metal plate 84, the source electrode 26 is brought into contact with the metal plate 84. The metal plate 82 is then placed on the semiconductor device 20. Next, a component that integrates the bus bar 30 and the insulator 32 is placed on the metal plate 84. In this case, the first portion 30a of the bus bar 30 is placed on the metal plate 82 while inserting the third portion 30c of the bus bar 30 into the penetrating hole 40d of the cylinder 40b. The insulating plate 80 is then placed on the first portion 30a of the bus bar 30. Next, by causing the thread groove 50c of the cover 50 to engage with the thread groove 40c of the case 40, the cover 50 is fixed to the case 40. When the cover 50 is moved downward by rotating the cover 50 around a central axis thereof, the flat plate portion 50a of the cover 50 comes into contact with the insulating plate 80. By further rotating the cover 50 from this state, the flat plate portion 50a of the cover 50 pressurizes the insulating plate 80 downward. More specifically, the laminated body sandwiched between the flat plate portion 50a of the cover 50 and the electrode plate 40a of the case 40 (in other words, the metal plate 84, the semiconductor device 20, the metal plate 82, the first portion 30a of the bus bar 30, and the insulating plate 80) is pressurized in a direction of lamination of the laminated body. Accordingly, respective members of the laminated body are fixed to the case 40 and to the cover 50.

Moreover, the metal plate 84 is softer than the source electrode 26 and the electrode plate 40a of the case 40 that are adjacent to the metal plate 84. Therefore, when the laminated body is pressurized, an upper surface of the metal plate 84 plastically deforms so as to conform to a surface shape of the source electrode 26 and the metal plate 84 comes into close contact with the source electrode 26. In a similar manner, when the laminated body is pressurized, a lower surface of the metal plate 84 plastically deforms so as to conform to a surface shape of the electrode plate 40a and the metal plate 84 comes into close contact with the electrode plate 40a. As a result, the source electrode 26 and the electrode plate 40a are electrically connected with each other securely.

In addition, the metal plate 82 is softer than the drain electrode 22 and the bus bar 30 that are adjacent to the metal plate 82. Therefore, when the laminated body is pressurized, a lower surface of the metal plate 82 plastically deforms so as to conform to a surface shape of the drain electrode 22 and the metal plate 82 comes into close contact with the drain electrode 22. In a similar manner, when the laminated body is pressurized, an upper surface of the metal plate 82 plastically deforms so as to conform to a surface shape of the bus bar 30 and the metal plate 82 comes into close contact with the bus bar 30. As a result, the drain electrode 22 and the bus bar 30 are securely connected with each other.

After the cover 50 is fixed to the case 40, the cooler 72 is attached to the cover 50 via the insulating sheet 70. Next, the cooler 62 is attached to the electrode plate 40a via the insulating sheet 60. Accordingly, the semiconductor module 10 shown in FIG. 1 is completed.

In the semiconductor module 10, the bus bar 30 and the pins 90 serving as the wiring to the semiconductor device 20 only penetrate the cylinder 40b and do not penetrate the cover 50. Therefore, the cover 50 can be freely rotated during assembly. As a result, the cover 50 can be attached to the case 40 by causing the thread groove 40c and the thread groove 50c to engage each other. In addition, this screw structure can pressurize and fix the laminated body. Consequently, the semiconductor module 10 can be assembled with ease.

Moreover, the semiconductor module 10 according to the first embodiment corresponds to respective components set forth in the claims as follows. The electrode plate 40a of the case 40 and the metal plate 84 constitute a first conductive member according to the claims. The cylinder 40b constitutes a cylinder according to the claims. The cover 50 constitutes a cover according to the claims. The bus bar 30 and the metal plate 82 constitute a second conductive member according to the claims. The pin 90 constitutes a third conductive member according to the claims.

(Second Embodiment)

Figure 3:
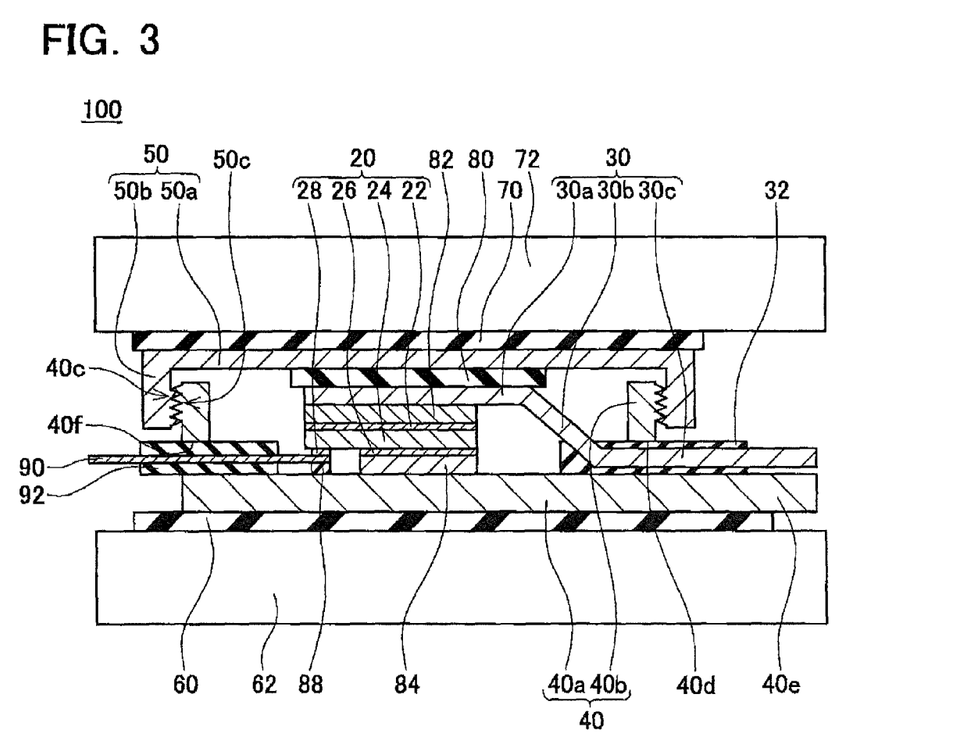
FIG. 3 is a longitudinal cross-sectional view of a semiconductor module 100 according to a second embodiment.

Next, a semiconductor module 100 according to a second embodiment shown in FIG. 3 will be described. The semiconductor module 100 according to the second embodiment shares a same configuration as the semiconductor module 10 according to the first embodiment with the exception of a connection structure between the pins 90 and the gate electrodes 28. Moreover, in the following description of the semiconductor module 100 according to the second embodiment, members corresponding to the respective members constituting the semiconductor module 10 according to the first embodiment are denoted by the same reference numbers as in the first embodiment.

In the semiconductor module 100 according to the second embodiment, respective pins 90 are not joined with the gate electrodes 28 and are only in contact with the gate electrodes 28. In addition, in the semiconductor module 100 according to the second embodiment, an insulating block 88 is installed on an upper surface of the electrode plate 40a at a position opposing the gate electrodes 28. The pin 90 is respectively fixed by being sandwiched between the insulating block 88 and the gate electrode 28. Accordingly, the pins 90 are electrically connected to the gate electrodes 28.

Next, a method of manufacturing the semiconductor module 100 according to the second embodiment will be described. First, the case 40 is prepared, and the metal plate 84 and the insulating block 88 are placed on the electrode plate 40a inside the cylinder 40b. A component that integrates the insulator 92 and three pins 90 is then installed. In doing so, the component is inserted into the penetrating holes 40f, and an end of each pin 90 at inside of the cylinder 40b is placed on the insulating block 88. Next, the semiconductor device 20 is placed on the metal plate 84. In doing so, the source electrode 26 is brought into contact with the metal plate 84, and each gate electrode 28 is brought into contact with a portion of each pin 90 on the insulating block 88. Subsequently, in a similar manner to the first embodiment, the metal plate 82, the bus bar 30, and the insulating plate 80 are installed, and the cover 50 is then fixed to the case 40. When the laminated body is pressurized by rotating the cover 50, the pressure is also applied to the pins 90 sandwiched between the gate electrodes 28 and the insulating block 88. Due to the pressure, the pins 90 are fixed to the gate electrodes 28. Subsequently, by mounting the coolers 62 and 72 in a similar manner to the first embodiment, the semiconductor module 100 according to the second embodiment is completed.

As described above, in the semiconductor module 100 according to the second embodiment, each pin 90 is fixed to the gate electrode 28 by pressure. In other words, each pin 90 is not joined to the gate electrode 28. Therefore, stress on the semiconductor device 20 around contact points between the pins 90 and the gate electrodes 28 are reduced. Accordingly, a reliability of the semiconductor device 20 is further improved.

Moreover, while the insulating block 88 is constituted by a different member from the electrode plate 40a in the second embodiment described above, the insulating block 88 may instead be fixed to the electrode plate 40a in advance.

Figure 4:
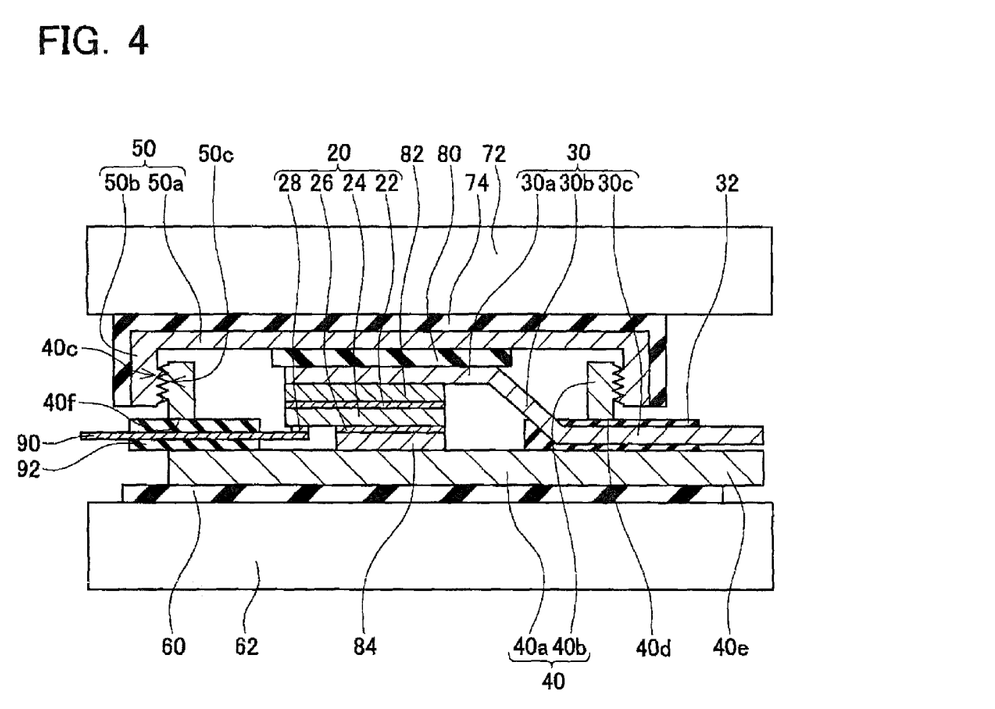
FIG. 4 is a longitudinal cross-sectional view of a semiconductor module according to a modification.
Figure 5:
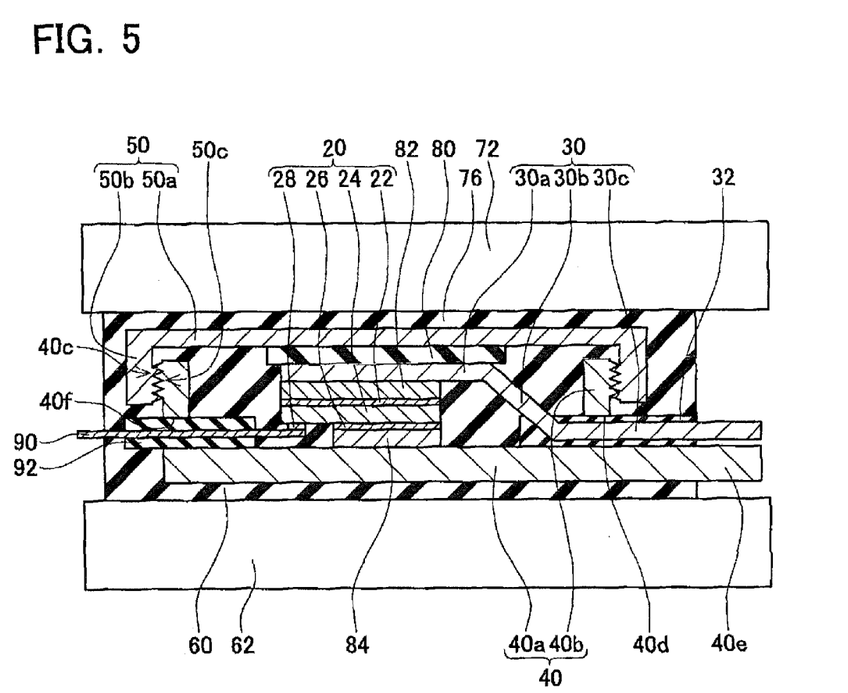
FIG. 5 is a longitudinal cross-sectional view of a semiconductor module according to a modification.

In addition, in the first and second embodiments described above, the cover 50 is fixed to the cooler 72 via the insulating sheet 70. Alternatively, an insulating film may be formed on a surface of the cover 50 and the cover 50 may be fixed to the cooler 72 via the insulating film. In a similar manner, in the first and second embodiments described above, the electrode plate 40a is fixed to the cooler 62 via the insulating sheet 60. Alternatively, an insulating film may be formed on a surface of the electrode plate 40a and the electrode plate 40a may be fixed to the cooler 62 via the insulating film. Furthermore, as shown in FIG. 4, an insulating cap 74 may be overlaid on the cover 50 and the cover 50 may be fixed to the cooler 72 via the cap 74. Alternatively, as shown in FIG. 5, an entire periphery of the case 40 and the cover 50 may be covered by an insulating resin 76, and the coolers 62 and 72 may be fixed to the resin 76.

Furthermore, while the cylinder 40b and the cover 50 are made of metal in the first and second embodiments described above, the cylinder 40b and the cover 50 may instead be formed of an insulator.

While preferred embodiments of the present disclosure have been described using specific terms, such description is for illustrative purposes only and is not intended to limit the scope of the following claims. The techniques described in the claims include various modifications and changes made to the specific embodiments illustrated above. The technical elements described in this specification or in the drawings exhibit technical utility singly or in various combinations and are not limited to the combinations recited in the claims as filed. Moreover, the techniques illustrated in this specification or in the drawings simultaneously attain a plurality of purposes, and attaining one of the purposes per se offers technical utility.

The invention claimed is:

1. A semiconductor module, comprising:
    a semiconductor device comprising:
        a semiconductor substrate,
        a first electrode formed on one surface of the semiconductor substrate, and
        a second electrode formed on a surface of the semiconductor substrate opposite to the one surface;
    a first conductive member being in contact with the first electrode;
    a second conductive member being in contact with the second electrode;
    a cylinder encompassing the semiconductor device and fixed to the first conductive member, and on an outer peripheral surface or an inner peripheral surface of which a first thread groove is formed; and
    a cover on which a second thread groove is formed, the cover being fixed to the cylinder by an engagement of the first thread groove and the second thread groove,
    wherein the semiconductor device and the second conductive member are fixed by being sandwiched between the first conductive member and the cover, and
    the second conductive member comprises an extending portion extending from inside the cylinder to outside the cylinder by penetrating an outer peripheral wall of the cylinder which is located on a side of the first conductive member with respect to the cover.

2. A semiconductor module of claim 1, further comprising:
    a third electrode formed on the one surface of the semiconductor substrate; and
    a third conductive member being in contact with the third electrode and extending from inside the cylinder to outside the cylinder by penetrating the outer peripheral wall of the cylinder which is located on the side of the first conductive member with respect to the cover.

3. A semiconductor module of claim 1, further comprising:
    a first cooler connected to a surface of the first conductive member which is opposite to the semiconductor device; and
    a second cooler connected to a surface of the cover which is opposite to the semiconductor device.

4. A semiconductor module of claim 1, further comprising an insulating member located between the third conductive member and the first conductive member,
   wherein the third conductive member is fixed by being sandwiched between the third electrode and the insulating member.

* * * * *